United States Patent [19]

Pathak et al.

[11] Patent Number: 5,270,980
[45] Date of Patent: Dec. 14, 1993

[54] SECTOR ERASABLE FLASH EEPROM

[75] Inventors: Jagdish Pathak, Los Alstos Hills; John Caywood, Sunnyvale, both of Calif.; Timothy J. Tredwell, Fairport; Constantine N. Anagnostopoulos, Mendon, both of N.Y.

[73] Assignee: Eastman Kodak Company, Rochester, N.Y.

[21] Appl. No.: 783,269

[22] Filed: Oct. 28, 1991

[51] Int. Cl.[5] .................. G11C 13/00; G11C 11/04; G11C 16/04
[52] U.S. Cl. .................. 365/218; 365/185; 365/184; 365/182; 257/314; 257/321
[58] Field of Search ............... 365/185, 218, 182, 184; 257/314, 328

[56] References Cited

U.S. PATENT DOCUMENTS

| | | | |
|---|---|---|---|
| 4,931,997 | 6/1990 | Mitsuishi et al. | 365/218 |
| 4,949,309 | 8/1990 | Rao | 365/218 |
| 4,996,571 | 2/1991 | Kume et al. | 357/23.5 |
| 5,034,926 | 7/1991 | Taura et al. | 365/185 |
| 5,109,361 | 4/1992 | Yim et al. | 365/185 |
| 5,172,338 | 12/1992 | Mehrotra et al. | 365/101 |

*Primary Examiner*—Eugene R. LaRoche
*Assistant Examiner*—Viet Q. Nguyen
*Attorney, Agent, or Firm*—David M. Woods

[57] ABSTRACT

A memory device is provided that includes a plurality of floating gate memory cells arranged in an array, where each memory cell includes a control gate, a drain and a source. A decoder is provided that applies a first erase voltage to the control gates of selected floating gate memory cells of the array to prevent erasure of the selected floating gate memory cells and a second erase voltage to the control gates of the remaining floating gate memory cells of the array to permit erasure of the remaining floating gate memory cells in a sector erase mode of operation. The decoder is also preferably capable of supplying the second erase voltage to the control gates of each of the floating gate memory cells in a bulk erase mode of operation.

3 Claims, 3 Drawing Sheets

SECTOR ERASABLE FLASH EEPROM

FIELD OF THE INVENTION

The invention relates generally to the field of electrically erasable programmable read-only memories (EEPROMs). More specifically, the invention relates to EEPROMs in which selected sectors of data can be erased.

BACKGROUND OF THE INVENTION

EEPROMs have been commercially available from the early 1980's and have become increasingly incorporated in applications requiring reliable nonvolatile memory that can be altered while incorporated in working circuitry. EEPROM devices, however, generally required cell sizes three to four times as large as more conventional erasable programmable read-only memories (EPROMs) or dynamic random access memory (DRAM) manufactured by the same scale technology. Thus, EEPROMs also had a significantly lower density and a corresponding higher cost than EPROMs or DRAMs.

Efforts to improve the density of EEPROM devices while reducing their associated cost by limiting features incorporated in the devices led to the development of so called Flash EEPROM devices. In particular, the Intel Corporation of Folsom, California developed a Flash EEPROM technology referred to as ETOX in which a memory cell is programmed when high voltages are applied to both a drain and control gate of the memory cell while source of the cell grounded. Under these conditions, a current flows from the drain to the source which creates hot electrons in the vicinity of a drain pinch-off region of the cell. Some of the hot electrons are collected by a floating gate of the cell which is coupled to a high potential by the voltage applied to the control gate. The memory cell is erased by applying a high positive voltage to the source with the control gate held at ground. A high electric field appears across a thin oxide layer between the floating gate and the source which causes electrons to quantum mechanically tunnel from the floating gate to the source which erases the cell. When implemented in an array, the sources of the memory cells in the array are connected in common so that the entire array can be simultaneously "Flash" or bulk erased.

While the ETOX cell technology offers many advantages over conventional EEPROM technologies in a variety of applications, there are many applications in which small blocks or sectors of data need to be altered in the memory while the remaining data is retained. In such cases, the bulk erase feature of the above-described memory device becomes a liability. It becomes necessary to provide a secondary memory media or storage buffer where the contents of the memory device are stored before performing the bulk erase operation. The altered sector may then be written to the memory device and the unaltered sectors retrieved from the secondary memory media. The disadvantages from using a secondary memory media are obvious, namely, more memory space is required by the system as a whole and the time required to alter a sector of data is greatly increased.

Flash EEPROM architectures have been proposed that would overcome the disadvantages of the bulk erase feature discussed above by permitting individual bytes of data to be erased. U.S. Pat. No. 4,949,309 issued to Rao, for example, discloses an array of floating gate transistors connected so that some of the floating gate transistors within the array can be erased without affecting the state of other floating gate transistors within the array. Alternatively, the entire array of floating gate transistors can be simultaneously erased. The byte erase feature is accomplished by dividing the sources of the memory cells into groups that are commonly connected to bulk erase transistors. Each bulk erase transistor can be individually addressed to selectively permit the erasing of the memory cells coupled thereto.

There are a number of disadvantages, however, to the architecture employed to provide the byte erase feature. For example, a significant area penalty results from the addition of the bulk erase transistors and the associated address lines required to control the operation of the bulk erase transistors which increases die cost and reduces potential yield, as well as lowering the potential density of the memory device. In addition, the bulk erase transistor also acts as an additional impedance on the source during programming which may cause difficulties during programming operations.

In view of the above, it would be desirable to provide a Flash EEPROM architecture having a sector erase capability that did not have the associated area penalty of conventional byte erasable Flash EEPROM devices. It would further be desirable to provide a Flash EEPROM architecture having a sector erase capability that by making a simple structural modification of conventional Flash EEPROM architectures, thereby reducing the time and expense associated with the development of a new memory architecture.

SUMMARY OF THE INVENTION

The invention provides a Flash EEPROM architecture having a sector erase capability. The architecture is based on a simple modification of conventional Flash EEPROM architectures, thereby permitting rapid and inexpensive incorporation of the invention in commercially available products. More specifically, a memory device is provided that includes a plurality of floating gate memory cells arranged in an array, where each memory cell includes a control gate, a drain and a source. A decoder is provided that applies a first erase voltage to the control gates of selected floating gate memory cells of the array to prevent erasure of the selected floating gate memory cells and a second erase voltage to the control gates of the remaining floating gate memory cells of the array to permit erasure of the remaining floating gate memory cells in a sector erase mode of operation. The decoder is also preferably capable of supplying the second erase voltage to the control gates of each of the floating gate memory cells in a bulk erase mode of operation.

BRIEF DESCRIPTION OF THE DRAWINGS

With the above as background, reference should now be made to the following detailed description of the preferred embodiment of the invention and the accompanying drawings in which.

DETAILED DESCRIPTION OF THE PREFERRED EMBODIMENT

The invention will be described with particular reference to the ETOX cell structure developed by the Intel Corporation. It will be understood, however, that the invention is applicable to other types of Flash EEPROM cell structures.

Figure 1:
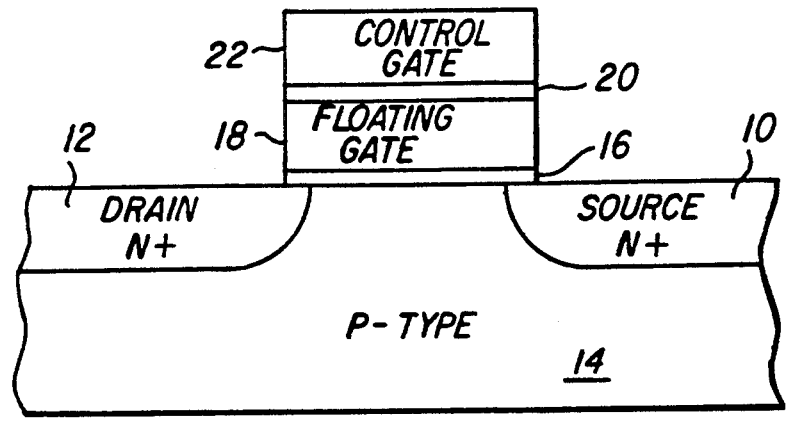
FIG. 1 is a representation of a conventional ETOX memory cell.

Referring now to FIG. 1, a representational illustration of a Flash EEPROM memory cell is shown including a source 10 and a drain 12 formed in a P-type substrate 14. A thin oxide layer 16, approximately 100-110 Angstroms, is formed over the substrate 14 and a floating gate 18 is formed over the thin oxide layer 16. A second insulating oxide layer 20 is formed over the floating gate 18 and a control gate 22 is formed over the insulating oxide layer 20.

The memory cell is programmed via hot electron injection and erased by Fowler-Nordheim tunneling. More specifically, in a conventional operating mode, the memory cell is programmed when a voltage in the range of about 7-8 volts is applied to the drain 12, a voltage of about 12-14 volts is applied to the control gate 22, and the source 10 is grounded (0 volts). Under these voltage conditions, current flows from the drain 12 to the source 10 which creates hot electrons in the vicinity of the drain pinch-off region of the memory cell. A portion of the hot electrons are collected by the floating gate 18 which is coupled to a high potential by the voltage applied to the control gate 22. The excess electrons on the floating gate 18 shifts the device threshold level so that the memory cell will not conduct for voltage levels of 5-6 volts applied to the control gate 22.

In an erase mode of operation, a high positive voltage of the order of 10-12 volts is applied to the source 10 while the control gate 22 is held at ground potential (0 volts). The drain 12 is left floating. The high electric field that appears across the thin oxide layer 16 between the floating gate 18 and the source 10 causes electrons to quantum mechanically tunnel from the floating gate 18 to the source thereby erasing the cell.

The state of the floating gate 18 determines whether the memory cell conducts during a read mode of operation which is indicative of whether a logic "1" or a logic "0" is stored in the memory cell. A voltage of approximately 1-1.5 volts is applied to the drain 12 and a voltage of approximately 5 volts is applied to the control gate 22 of the memory device during a read operation. Under these voltage conditions, the memory cell will either conduct current or will be turned off (i.e. non-conducting state) based on the charge state of the floating gate 18. A sense amplifier is utilized to determine whether the memory cell is conducting current or is turned off and generates a signal indicative thereof. A conducting cell represents a stored logic "1" and a cell that is turned off represents a stored logic "0".

As described above, it is necessary to have a field across the source junction and the floating gate oxide of sufficient magnitude to cause electrons to tunnel from the floating gate to the source in order to erase the memory cell. Conventional Flash EEPROM devices accomplished the erasing of an array of memory cells by keeping the control gates at ground while raising the commonly connected sources to 10-12 volts, which resulted in a simultaneous erase of all of the memory cells in the array. Previous attempts at providing a sector or byte erase capability in a Flash EEPROM architecture have focused on dividing the sources into various sectors and decoding the sectors. This byte erase architecture, however, results in a significant area penalty.

Figure 2A:
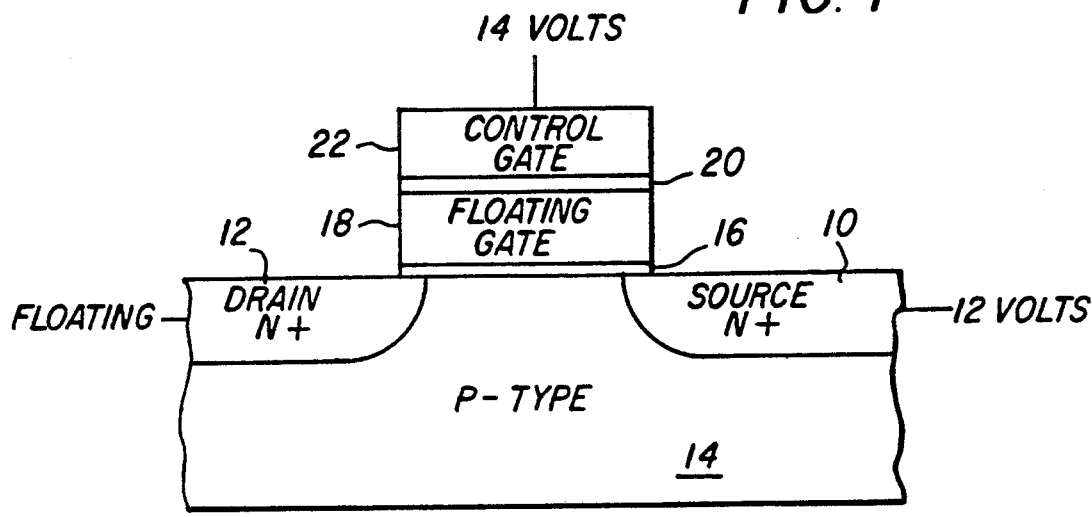
FIG. 2A illustrates the application of erase voltages in accordance with the present invention to prevent erasure of a memory cell of the type illustrated in FIG. 1.
Figure 2B:
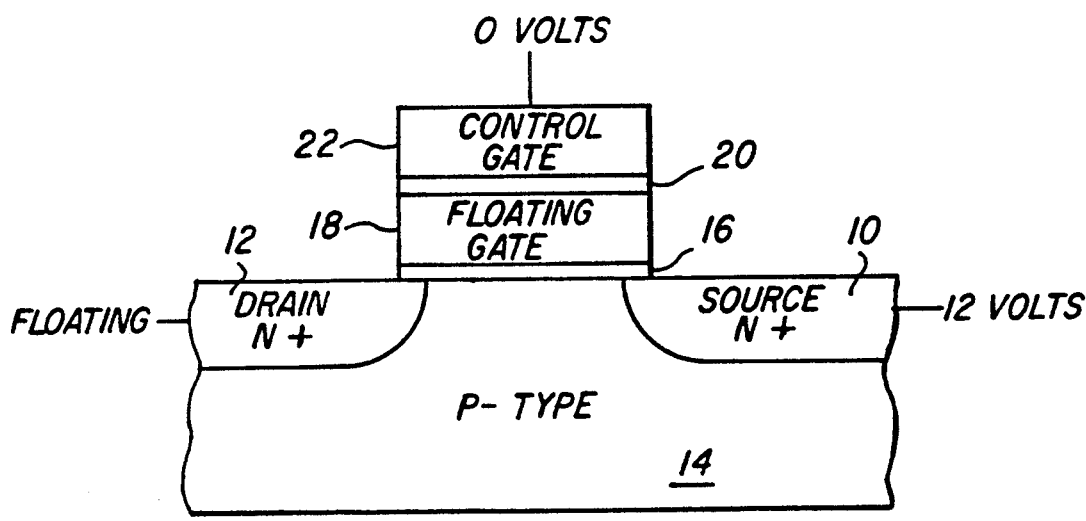
FIG. 2B illustrates the application of erase voltages to erase a memory cell of the type illustrated in FIG. 1.

The invention is based on the recognition that the dividing of the sources into sectors can be avoided if the field across the source junctions of those memory cells which are not to be erased is significantly reduced to prevent tunneling from occurring. The reduction of the field is accomplished by applying a 12-14 volt potential on the control gate of those memory cells which are not to be erased. For example, FIG. 2B illustrates the classical voltage conditions for erasure where the electrons will tunnel through the floating gate 18 to the source 10. In FIG. 2A, however, the coupling from the control gate 22 to the floating gate 18 will increase the floating gate potential which in turn will significantly reduce the field across the source junction thereby preventing tunneling.

The following simplified calculations illustrate the reduction of the field strength:

$$Vfgs = Vsiyrce - (Vfg + Vsource * CCs-fg + Vcg * CCcg-fg)$$

where:
Vfgs = voltage between the floating gate and source
Vfg = voltage of floating gate
Vcg = voltage on control gate
CCs−fg = capacitive coupling source to floating gate
CCcg−fg = capacitive coupling control gate to floating gate Assuming that the capacitive coupling between the control gate and the floating gate is sixty percent, the capacitive coupling between the source and the floating gate is fifteen percent, and the voltage on the floating gate is -3 volts for a programmed cell, then:

$$Vfgs = 12 - (-3 + 12 * 0.15 + 0 * 0.6) = 13.2 \text{ volts}$$

The resulting voltage is sufficient to cause tunneling across the thin oxide layer 16. However, if the voltage on the control gate is raised as illustrated in FIG. 2A, then:

$$Vfgs = 12 - (-3 + 12 * 0.15 + 14 * 0.6) = 4.8 \text{ volts}$$

The resulting voltage is insufficient to cause tunneling and the cell will not erase. The same calculation can be made in the case of an unprogrammed cell with the resulting field being in the range of 1.8 volts.

The above analysis illustrates that sector erase can be accomplished by selectively raising the voltage applied to the control gates of those cells which are not to be erased. The selective application of the higher voltage to the control gates can be accomplished by a simple modification to the conventional row or word line decoder coupled to control gates in conventional memory array structures. In other words, the word line decoder can be modified such that only one word line is selected during read or program modes of operation out of the total number of word lines, while a block of word lines, coupled to the memory cells to be erased, go to ground potential and the remaining word lines go to 14 volts during an erase operation. The conventional array structure itself, along with the common connection of the sources, can be retained thereby avoiding the area penalty associated with conventional byte erase Flash EEPROM structures.

Figure 3:
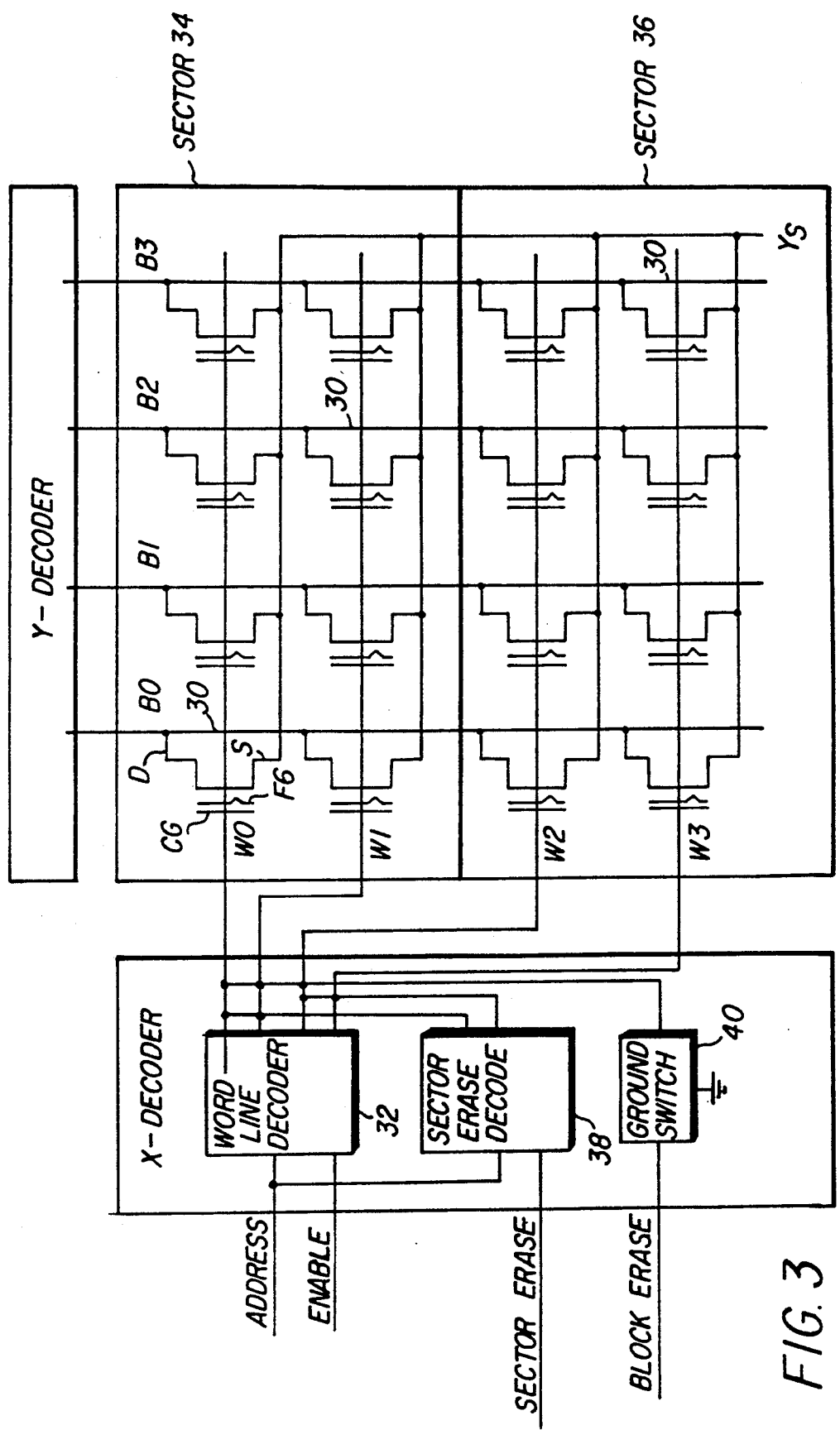
FIG. 3 illustrates a Flash EEPROM with sector erase capability in accordance with the present invention.

A simplified schematic diagram of a Flash EEPROM incorporating the invention is illustrated in FIG. 3. A four by four array of conventional memory cells 30 is illustrated with the control gate (CG) of each memory cell 30 being connected to a corresponding word line (W0-W3), the drains (D) of each memory cell 30 being connected to corresponding bit lines (B0-B3), and the sources (S) being commonly connected. A word line decoder 32 has corresponding output lines coupled to each of the word lines W0-W3. The memory cells 30 attached to the word lines W0-W3 are grouped into two sectors for erase purposes; the first sector 34 contains those memory cells 30 coupled to the first two word lines W0-W1, while the second sector 36 contains those memory cells 30 coupled to the second two word lines W2-W3. A sector erase decoder 38 has outputs commonly connected to the first two word lines W0-W1 and the second two word lines W2-W3. Each of the word lines W0-W4 are also commonly connected to ground switch 40. The word line decoder 32, the sector erase decoder 38 and the ground switch 40 in practice represent the "X" or row decoder for the array of memory cells.

During read and programming operations, address data is supplied to the word line decoder 32 via an address bus and the word line decoder 32 selectively applies the appropriate voltage (5 volts for a read operation and 12 volts for a programming operation) to one of the word lines W0-W3 in a conventional manner. The appropriate voltages are also applied to the bit lines B0-B3 and the commonly connected source lines (Vs) in order to complete the read or programming operation.

During erase operations, however, the address data is supplied to the sector erase decoder 38. The sector erase decoder 38 selects one of the first or second sectors 34, 36 for erasure based on the received address data. The word lines of the sector to be erased are held at ground while a voltage level of between 12-14 volts is applied to the word lines of the sector to be retained. A block erase of all sectors is accomplished by activating the ground switch 40 to ground the word lines W0-W3.

It will be understood that the invention is not limited to the specific embodiment illustrated in FIG. 3, but is applicable to any size array and the sectors can be chosen to be of any desired size, including a single row. For example, in the case of a one megabit Flash EEPROM memory organized in an array of 1024 rows and 1024 columns with a desired erase sector size of 16 Kbit blocks, the X decoder can be a 1 of 1024 select decoder for read and program operations by selecting an individual row, while operating as a 1 of 64 select decoder for sector erase operations by simultaneously selecting sixteen rows at a time. The actual circuit implementation can be achieved using a variety of circuit configurations.

Figure 4:
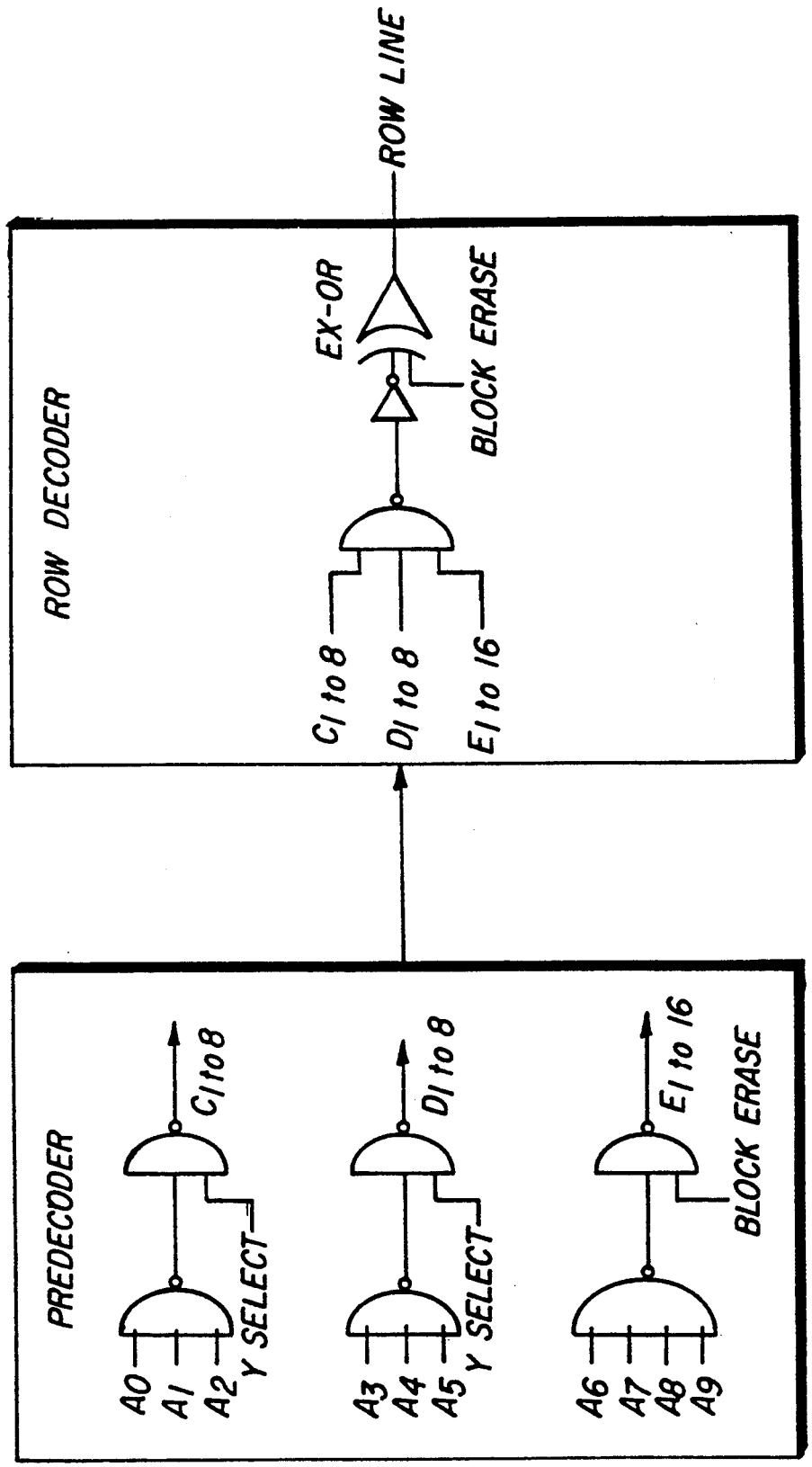
FIG. 4 is a schematic diagram of a decoder in accordance with the present invention.

FIG. 4 illustrates one circuit implementation that utilizes a predecoder in conjunction with a row decoder. In the illustrated example, the BLOCK ERASE line is "0" and the BLOCK ERASE line is "1" during read and program operations. This will yield a 1 of 1024 decode scheme with a selected row line going high. During an erase mode of operation, the BLOCK ERASE line is "1" and the BLOCK ERASE line is "0" which will cause sixteen selected row lines to go low and the remaining row lines to go high. The "Y" input control can be used for bulk erase operations with all row lines being brought to ground potential.

There is one potential problem with the above-described sector erase scheme in the case of an "unprogrammed" cell that lies in a sector which is not o erased. The drain or bit line is left floating. In large memory arrays, the bit line can be a high capacitive node when many bits are tied to the bit line. The floating drain will charge up by many cells in parallel, but during that charging time some hot electrons may be going to the floating gate. There is a possibility that the threshold of the cell may slowly rise to the level where it appears to be programmed if this occurs many times. Although this may be a very slow process, it is a potential problem that can be easily eliminated by raising the floating drain to a high voltage at the same time as the source. There will not be enough lateral field to generate hot electrons if the drain and source are at the same potential. This can be accomplished by shorting the drain and source lines together, preferably by using an extra transistor at the sector level or global chip level.

The invention has been described with reference to certain preferred embodiments thereof. It will be understood, however, that variations and modifications are possible within the scope of the appended claims.

What is claimed is:

1. A memory device comprising:

a plurality of floating gate memory cells arranged in an array of rows and columns, wherein each memory cell includes a control gate, a drain and a source, and wherein the control gates of the memory cells in the rows of the area are connected to common word decode lines, the drains of the memory cells in the columns of the array are connected to common column decode lines, and the sources of all of the memory cells are commonly connected to a source voltage line; and erase decoding means, coupled to the word decode lines, for applying a first erase voltage to the control gates of a first group of said memory cells to prevent erasure of said first group of memory cells and for applying a second erase voltage to the control gates of a second group of said memory cells to permit erasure of said second group of memory cells when a source erase voltage is applied to said source voltage line in a sector erase mode of operation;

wherein said first erase voltage is greater than said source erase voltage and said source erase voltage is greater than said second erase voltage, and wherein said first erase voltage is sufficient to prevent tunneling of electrons from floating gate regions of the first group of memory cells to the sources of the first group of memory cells.

2. A memory device as claimed in claim 1, wherein said erase decoding means includes means for applying said second erase voltage to the control gates of each of said floating gate memory cells when the source erase voltage is applied to said source voltage line in a bulk erase mode of operation.

3. A memory device as claimed in claim 2, wherein said first erase voltage is approximately 12-14 volts and said second erase voltage is approximately ground potential.

* * * * *